United States Patent [19]

Cook et al.

[11] Patent Number: 4,771,234
[45] Date of Patent: Sep. 13, 1988

[54] VACUUM ACTUATED TEST FIXTURE

[75] Inventors: Stephen J. Cook; Kris J. Kanack, both of Loveland, Colo.

[73] Assignee: Hewlett-Packard Company, Palo Alto, Calif.

[21] Appl. No.: 933,403

[22] Filed: Nov. 20, 1986

[51] Int. Cl.$^4$ .............................................. G01R 1/04
[52] U.S. Cl. .................................................. 324/158 F
[58] Field of Search ........... 324/73 PC, 158 F, 158 P; 439/54

[56] References Cited

U.S. PATENT DOCUMENTS

| 4,322,682 | 3/1982 | Schadwill | 324/73 PC X |
| 4,352,061 | 9/1982 | Matrone | 324/158 F |
| 4,538,104 | 8/1985 | Douglas et al. | 324/73 PC X |
| 4,573,009 | 2/1986 | Fowler et al. | 324/158 F |
| 4,626,776 | 12/1986 | Wilkinson | 324/73 PC |

FOREIGN PATENT DOCUMENTS

| 3311977 | 10/1984 | Fed. Rep. of Germany | 324/73 PC |
| 2111307 | 6/1983 | United Kingdom | 324/73 PC |
| 2139019 | 10/1984 | United Kingdom | 324/158 F |

Primary Examiner—Reinhard J. Eisenzopf
Assistant Examiner—Stephen M. Baker
Attorney, Agent, or Firm—Bloor Redding, Jr.

[57] ABSTRACT

A fixture is disclosed for connecting circuit cards having electronic components to a board test system. The fixture is vacuum actuated. The test fixture comprises a fixture base and a support assembly. The fixture base comprises a board test system interface, supports, probe plate and electrical connections. The probe plate contains an integral vacuum chamber with molded supports. The support assembly comprises a first seal, a support plate, a second seal, and a third seal. The circuit card is positioned by two tooling pins located in the probe assembly. The card is electrically connected to the test system through a probe, connecting wire, and a scanner pin. Two new seals are disclosed.

5 Claims, 7 Drawing Sheets

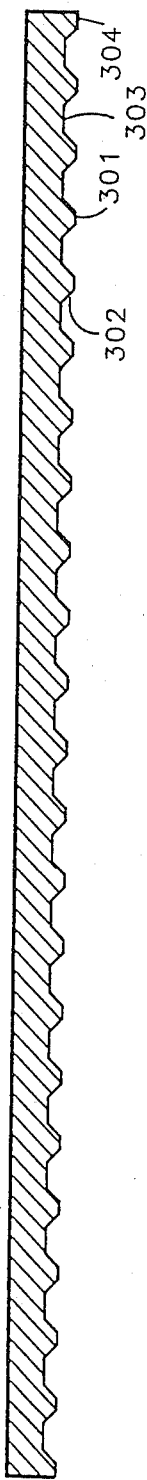
FIG 3B
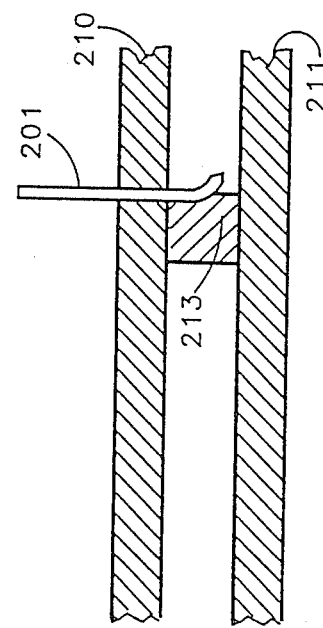
FIG 4B
FIG 4A
(PRIOR ART)

VACUUM ACTUATED TEST FIXTURE

BACKGROUND

1. Field of Invention

This invention relates to the field of art pertaining to test fixtures for board test systems and other mechanical interfaces for electrically interconnecting circuit cards having electronic components and the like to electrical switching systems.

2. Description of the Prior Art

A board test system consists of numerous electronic sources and detectors which are connected through an electric switch, or scanner, to a plurality of contact points referred to as scanner pins. A test fixture provides a mechanical and an electrical interface between thesee scanner pins and the electronic components located on a circuit card to be tested. Electronic signals are employed by the board test system to determine whether each electronic component on the circuit card is operating properly. Since these signals must pass through the test fixture both on their way to and from the electronic component, the test fixture must not degrade the quality of these signals in order to insure that the electronic component is correctly diagnosed as operating properly or improperly.

Prior art vacuum actuated test fixtures are typically constructed from two plates. The first plate, or probe plate, is a thick plate made from an insulator having holes corresponding to the locations of the electronic components on the circuit card. The probing means are mounted in these holes. Typically the probing means comprises a spring loaded probe and a probe socket. A second plate, or top plate, having holes corresponding to the location of the probing means, is mounted on alignment pins and held above the probe plate by preloaded fixture springs. A seal is then placed around the perimeter of the plates to form a vacuum chamber. When air is removed from the vacuum chamber, the top plate is drawn toward the probe plate causing each probing means to pass through its corresponding hole in the top plate and strike an electronic component on the circuit card. The circuit card is positioned relative to the top plate by two or more tooling pins and held in place by the vacuum. Some prior art fixtures have replaced the top plate by a flexible membrane.

In order to ensure a high quality signal path to and from the test system, the probing means must make a firm electrical and mechanical contact with the component. Two essential factors for making a good electrical and mechanical contact are, first, proper alignment between the probing means and the electronic components and, second, a uniform force by the probing means against the component. Although these factors are easily achieved for a few probing means in a test fixture, it is very difficult to achieve a good electrical and mechanical contact for each probing means over the entire test fixture. There are two primary reasons for these difficulties in the prior art. First, the force from the spring loaded probing means must be carefully balanced against the force from the fixture springs located between the top and probe plates. If the fixture springs are too weak, the circuit card will pop off during the test and if they are too strong, the circuit card will not be drawn down properly making a poor connection. If the spring loaded probing means is too strong, the circuit card will pop off during the test and if they are too weak, the circuit card will not be probed properly again making a poor connection. A poor connection between the probing means and the electronic component somewhere in the test fixture usually results from having to make this tradeoff. Second, since the alignment with the circuit card is provided by tooling pins in the top plate, a precise registration must also be maintained between the top plate and probe plate making the fixture more expensive to manufacture and less accurate.

Another problem with the prior art vacuum actuated fixtures is difficult maintenance. With the prior art vacuum test fixture, dirt and solder particles are often sucked into the fixture requiring the fixture to be opened. The seals around the perimeter of the plates also wear out and need replacement. However, opening the fixture is difficult, since any misalignment during disassembly or reassembly could damage the probing means and the springs must be carefully removed during disassembly and replaced during reassembly. Therefore, fixture repair is a very time consuming process.

Yet another problem with the fixture springs of the prior art test fixture is the large quantity of vacuum required to actuate the fixture and the noise made while the fixture is actuated. The fixture springs also cause the circuit card to warp when the fixture is actuated which complicates maintaining proper registration of the probing means and selecting of the proper spring force for the probing means. In addition, the circuit card may be permanently damaged by the force. In order to prevent the top and probe plate from being warped, thicker plates are used adding additional weight of the test fixture. Even with thicker plates, some fixtures require the use of stop supports between the top and probe plates. In order to prevent the circuit card from being warped, supports are placed between the circuit card and the top plate.

A few single plate fixtures have been developed. These fixtures comprise a probe plate which is almost identical to the probe plate of the two plate fixture. A thick layer of foam is placed directly on top of the probe plate. The foam is removed from the probe plate directly under the circuit card except for the approximately one-half inch around the perimeter of the circuit card which serves as the vacuum seal. The primary disadvantage of such a fixture is that the probing means are always exposed when the fixture is not actuated. The exposed probing means may be easily damaged or cause injury to an operator. Also these test fixtures generally make a poorer contact than the two plate fixture because there is limited travel of the circuit card against the foam seal. Another disadvantage of this fixture is that the circuit card is not supported while the fixture is being actuated making it more susceptible to damage by warping. Such damage may include breaking electronic components, solder joints or both.

What is required is a test fixture which is capable of making a repeatable and reliable high quality connection between the electronic components on the circuit card and the board test system.

SUMMARY

In accordance with the preferred embodiment of the present invention, an apparatus is described for interfacing an automatic board test system to an electronic circuit card. The interface permits reliable electrical connections between the board test system and electronic components located on the circuit card.

The primary object of this invention, therefore, is to provide a method for distributing the force created by the vacuum evenly over the circuit card so as to generate a mechanically secure and electrically reliable connection with the electronic component under test.

Another object of the present invention is to provide a means which significantly eliminates the need for fixture springs. By reducing the spring force required to actuate the fixture, the electronic circuit card is less likely to warp.

A further object of the present invention is to provide a simple and inexpensive structure which may be automatically drilled. The present invention should require considerably less expensive drilling, milling and machining than prior art fixtures.

The fixture comprises a plate assembly, a support member, a vacuum manifold, a scanner plate, a support plate, a first seal, a second seal, and a third seal. The plate assembly replaces the bulky two plate system of the prior art resulting in a lighter and stronger fixture. The first seal replaces the fixture springs and seal between the top and probe plate of the prior art, thereby eliminating the pop off and warping problems of the prior art. The present invention is more easily maintained than the prior art because the support plate is easily removed for cleaning and probe replacement. Less vacuum is required to actuate the test fixture because of the reduced volume of the vacuum chambers and the elimination of the fixture springs. The present invention improves the accuracy of the prior art fixture without additional expense by referencing both the support plate and the circuit under test to tooling pins located in the plate assembly.

DESCRIPTION OF DRAWINGS

FIG. 3A is a bottom view of a vacuum plate and FIG. 3B is a cross sectional view of the vacuum plate.

FIGS. 4A and 4B are cross sectional views of a probe plate plate illustrating the drilling of various support shapes.

DESCRIPTION OF THE PREFERRED EMBODIMENT

Figure 1:
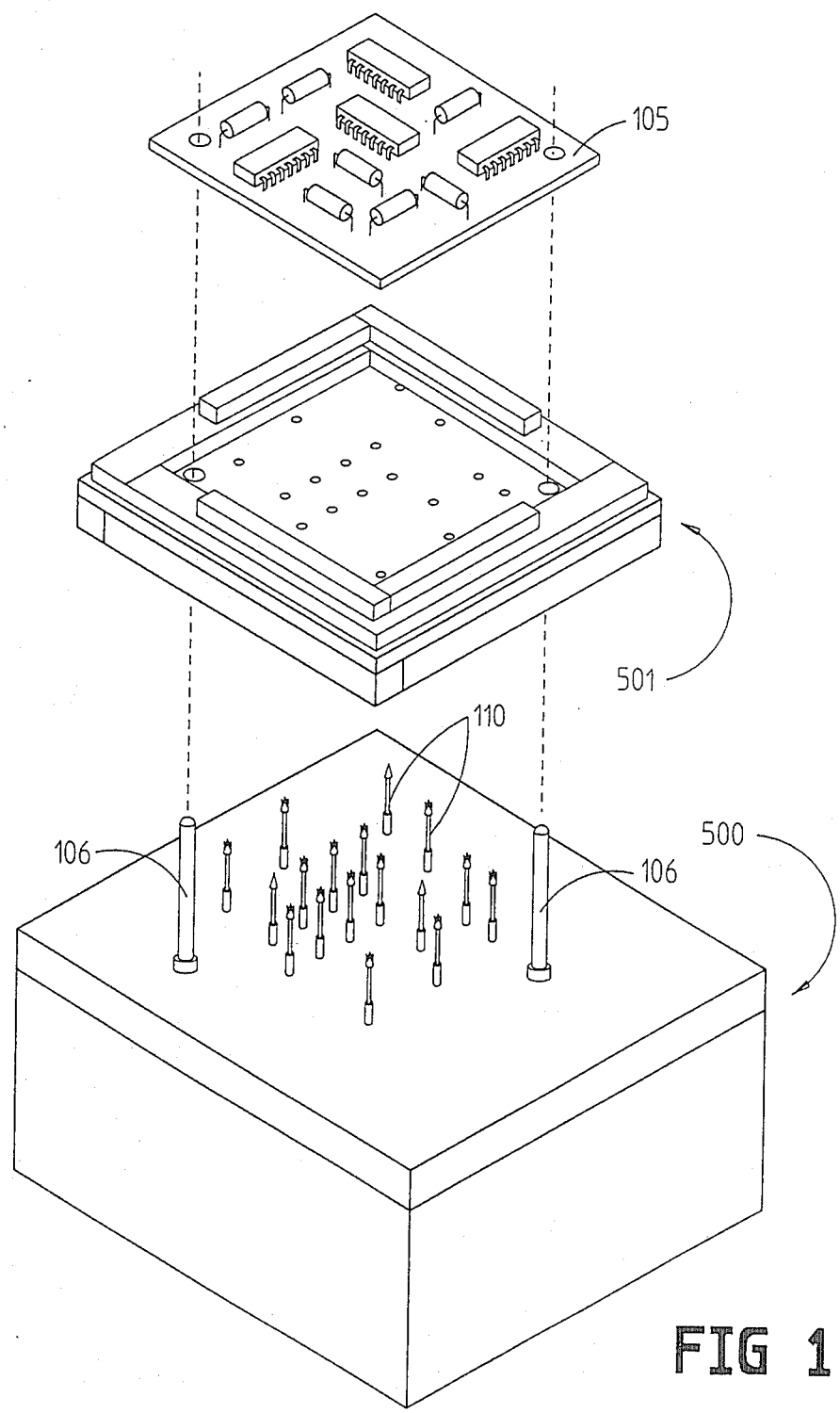
FIG. 1 is an exploded view of the preferred embodiment of the present invention.

FIG. 1 is an exploded view of the preferred embodiment of the present invention. The test fixture comprises two major assemblies. The first assembly is the fixture base 500 which provides the mechanical interface to the test system and the electrical signal path between probing means 110 and the test system. The second assembly is the support assembly 501 which protects the probing means 110 and may be easily separated from the fixture base for maintenance. The probing means 110 pass through the support assembly 501 to make contact with the circuit card 105. Alignment between the fixture base 500, the support assembly 501 and the circuit card 105 is maintained by the tooling pins 106.

Figure 2:
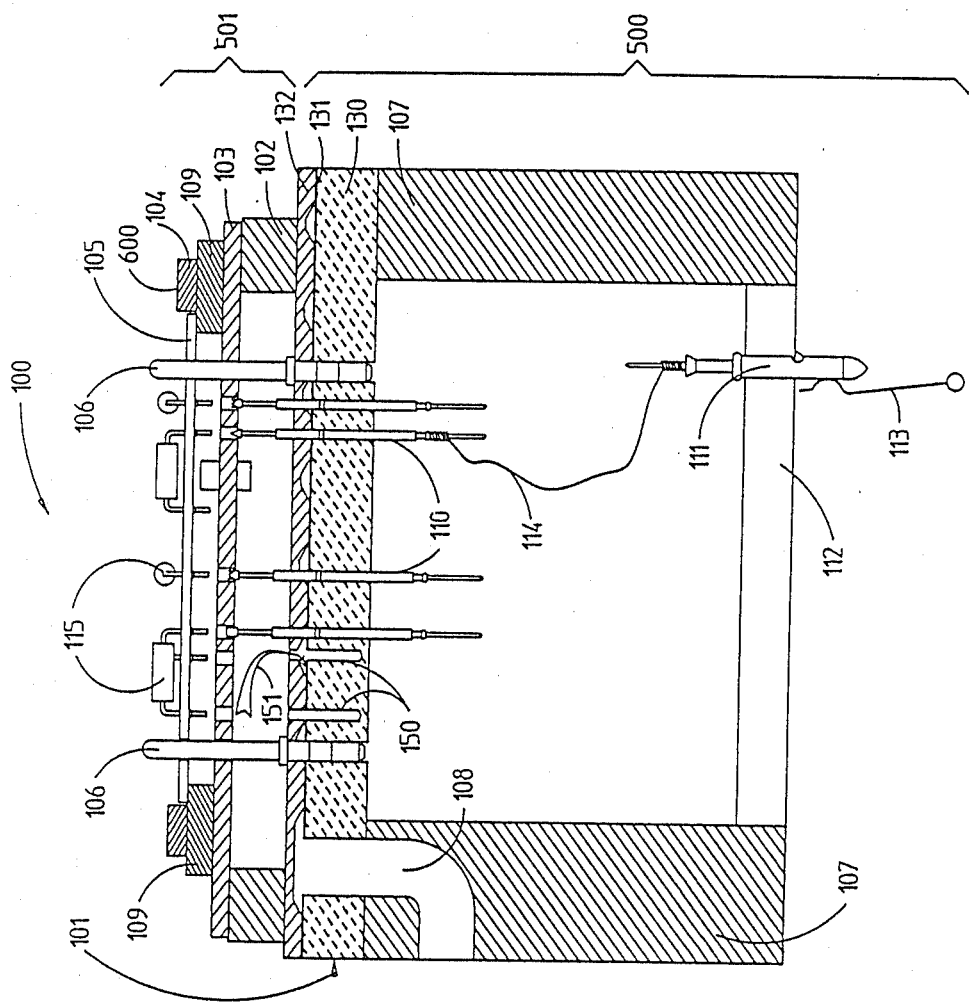
FIG. 2 is a fragmentary elevational view of the preferred embodiment of the present invention.

FIG. 2 is a fragmentary elevational view of the preferred embodiment of the present invention. A test fixture 100 is employed to connect the board test system through paddle pin 113 to electronic components 115 located on a circuit card 105. The fixture base 500 comprises a plate assembly 101, support member 107, a vacuum manifold 108, and scanner plate 112. The support assembly 501 comprises support plate 103, first seal 102, second seal 109 and third seal 104. Two tooling pins 106 mounted in the plate assembly 101 maintain the spacial alignment between the plate assembly 101, the support plate 103 and circuit card 105.

The circuit card 105 is electrically connected to the board test system through probing means 110, connecting wire 114, and scanner pin 111. The probing means 110 typically comprises a spring loaded probe mounted in a probe socket. The probe socket is inserted in the plate assembly 101 in holes 150 which drilled according to the location of components on the circuit card 105. A connecting wire 114 is employed to connect the probing means 110 to the scanner pin 111. The scanner pin 111 is mounted in scanner plate 112. The scanner plate 112 contains holes on a regular grid which corresponds to the location of paddle pins 113 in the board test system. The scanner pin 111 aligns with a paddle pin 113 located to complete the signal path. The fixture 100 must be rigidly and precisely attached to the board test system. Various prior art methods may be employed to ensure that the fixture is properly attached.

The plate assembly 101 comprises a probe plate 130 and a vacuum plate 132. The probe plate 130 is constructed from a rigid flat insulator. In the preferred embodiment, the probe plate 130 is a flat piece of epoxy fiberglass laminate material which is approximately seven-sixteenths inch thick. The vacuum plate 132 is made from a polyester fiberglass material which is approximately one-eighth inch thick. The vacuum plate 132 may be machined, or preferably molded, to have approximately a one-sixteenth inch depression beginning approximately one-quarter inch from the sides. This depression when assembled next to the probe plate forms a small vacuum chamber which runs the entire length and width of the fixture. Air is removed from the vacuum chamber in plate assembly 101 through manifold 108.

Figure 3A:
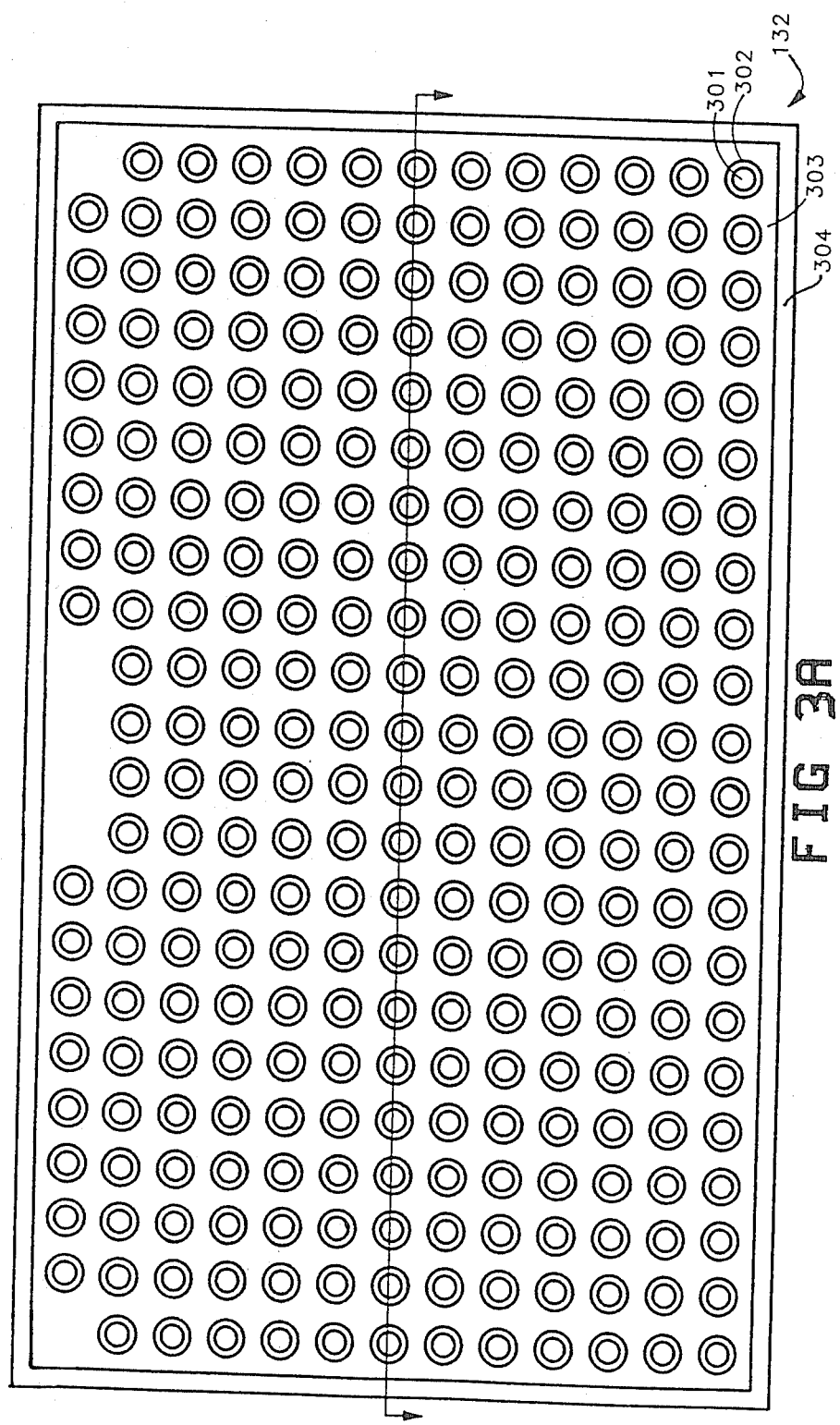

Since the plate assembly 101 must be structurally rigid to support the circuit card and the bending forces caused when the vacuum is applied, the vacuum plate 132 contains supports. In the preferred embodiment, the supports are molded into the vacuum plate. FIG. 3A is a bottom view of a vacuum plate with edges 304, depressed region 303, and supports 301. FIG. 3B is a cross sectional view of the vacuum plate. The edges 304 and supports 301 are securely attached to the probe plate to form the vacuum chamber. The supports 301 make the probe assembly rigid and eliminate any flexing due to the force from the vacuum.

FIGS. 4A and 4B are cross sectional views of a probe assembly illustrating the effect on a drill of various supports. FIG. 4A illustrates the effect of drilling with a drill bit 201 a point which is in line with a prior art support 213. Drilling down the side of support 213 causes the drill bit 201 to be deflected away from a straight hole. The resulting hole is bent and results in a misaligned probe socket. Therefore, in order to prevent misaligned probe sockets, the prior art supports 213 must be installed after the probing means holes are drilled rather than molding the supports into the vacuum plate as taught by the preferred embodiment of the present invention. In order to prevent misaligned probe sockets, but still allow the fixture to be drilled at any point, the supports 301 are tapered. The tapered supports 301 may therefore be located anywhere and may be molded into the vacuum plate 132 to reduce production cost. By molding the supports 301 in place, rather than placing the supports manually, the manufacturability of the fixture is greatly enhanced. The taper required for the supports is approximately equal to the angle of the drill bit used to drill the plate assembly, usually between twenty to thirty degrees.

In the preferred embodiment of the present invention as shown in FIG. 2, the two plates 130 and 132 are laminated together with lamination material 131. The one piece laminated probe assembly 101 combines two functions into one part. The plate assembly 101 provides a rigid base for mounting the probing means 110 and for ducting vacuum through the fixture to the vacuum manifold 108. Laminating the vacuum plate 132 to the probe plate 130 results in a permanent sealing of the perimeter of the vacuum chamber and results in the formation of a single lighter structural member. Also, by laminating the two plates together, the thickness of each plate may be reduced without sacrificing stiffness.

As illustrated in FIG. 2, a second vacuum chamber is formed in the area immediately above the vacuum plate by the plate assembly 101, seal 102 and support plate 103. The support plate has holes located according to the location of the electronic components on the circuit card. Air passes through these holes, around the probe sockets and through the first vacuum chamber when the fixture is actuated. Air cannot pass into the first vacuum chamber from the bottom of the plate assembly 101 because the base of the probe sockets are expanded forming a press fit with the plate assembly 101. When the fixture is actuated, the probing means 110 extends through these holes to contact the circuit card 105. The support plate 103 is approximately five-eighths inch larger on each side than the circuit card 105. The seal 102 of the preferred embodiment is approximately square in shape and three-eighths to one-half inch wide. The seal comprises an inner core and an outer shell. The inner core of the seal comprises a foam strip, which is not impermeable to air flow. The foam material must be a low compression set and require low compression force to operate reliably. The outer shell of the seal comprises of a thin film surrounding the foam making the seal air tight. The outer shell must be flexible in order to prevent air leaks between the seal and the board and to reduce the force required to actuate the fixture. The outer shell may or may not be attached to the foam. In the preferred embodiment, the foam of the inner core is an open cell urethane and the thin film of the outer shell is a urethane membrane not attached to the core.

The second vacuum chamber formed by the seal 102, plate assembly 101, and support plate 103 is only slightly larger than the circuit card 105. The seal 102 replaces the springs between the plates of the prior art. By eliminating these springs, the test fixture no longer needs to be shipped with an assortment of springs having different spring constants. Also by eliminating the springs, the present invention prevents the circuit card 105 from popping off upon contacting the probing means 110. Merely replacing the fixture springs of the prior art with a seal is not effective unless both the weight of the support plate 103 is reduced by making the support plate 103 thinner and the size of the support plate 103 is reduced until it is slightly larger than the circuit card 105. The seal 102 employs an adhesive on top of the seal to securely attach the seal to the support plate 103. The bottom of the seal 102 is covered by a low tack adhesive which holds the support assembly 501 with its seals to the plate assembly 101, but is easily separated by lifting up on the support plate making the test fixture easy to service.

A third vacuum chamber is formed by the support plate 103, a seal 109 and the circuit card 105. Supports may be placed between the circuit card 105 and the support plate 103 when needed. The seal 109 is made of a cellular foam which is only slightly compressible.

A third seal 104 may be optionally employed to further enhance the reliability and quiet operation of the fixture. The addition of seal 104 along the edge of the circuit card 105 on top of the second seal 109 ensures a good seal when the test fixture is actuated. The third seal 104 is especially important when the circuit card to be tested is warped. The third seal also maintains a seal around the circuit card edge as the vacuum source is removed and the air at atmospheric pressure rushes in. The seal 104 helps to prevent the circuit card from jumping off the test fixture.

Wear on the second and third seal by leads protruding from the bottom of the circuit card 105 is significantly reduced by placing a slick, abrasion resistant material 600 to the top of the third seal 104. In the preferred embodiment, the third seal comprises a composite of 0.01 inch of epoxy fiberglass laminant material with a cellular urethane foam. The two materials are laminated together with an unsupported acrylic transfer adhesive. The same adhesive is employed to attach the third seal 104 to the top of the second seal 109.

The fixture is assembled as follows. The first step in building a fixture is to drill the plate assembly 101. The test engineer first selects the points on the circuit card 105 which must be probed. This is typically done on a CAD/CAM system which contains all the points where components are attached. Once the points are selected, the plate assembly is drilled typically by a numerically controlled drill. The drill drills though the vacuum plate and into the probe plate. The points to be probed are drilled completely through the plate assembly. The points where components are attached but which are not to be probed are drilled stopping approximately the one sixteenth inch before reaching the opposite side of the probe plate 130. This permits the plate assembly to be conveniently drilled by hand later in the event the fixture needs to be modified. The partially drilled holes also serve to allow air to pass from the second vacuum chamber into the first vacuum chamber in the plate assembly 101 as shown by arrow 151. Next, the support plate 103 is drilled. The support plate 103 is drilled at all points where the electronic components are located on the circuit card 105. Two or more tooling holes are drilled in the plate assembly 101 and the support plate 103. Then, the tooling pins 106 and the probes are loaded into the plate assembly 101. The support members 107 and vacuum manifold 108 are then attached and the fixture wired.

Next, the first seal 102 is cut and attached to the bottom of the support plate 103 and the second seal 109 is cut and attached to the top of the support plate 103. The seals are trimmed to length and the corners are assembled by butting the end of one strip to the side of another. The seals attached to the support plate with acrylic pressure sensitive adhesive which is part of the seal. The seals come in strips which are easily cut to the proper length when building the fixture. The support plate is then placed over the tooling pins. The circuit card 105 is then placed on top of the support plate 103 and the third seal 104 is cut and attached around the perimeter of the circuit card to the top of the second seal 109. The fixture is now ready to be used.

Figure 5:
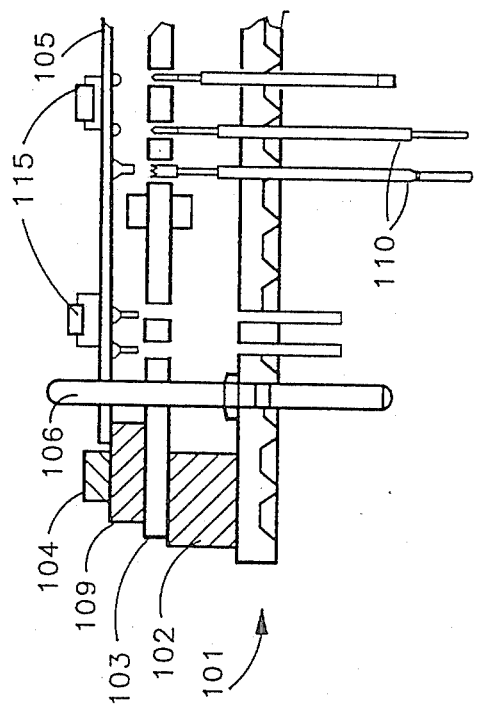
FIG. 5 is a fragmentary elevational view of the preferred embodiment of the present invention with the fixture released.
Figure 6:
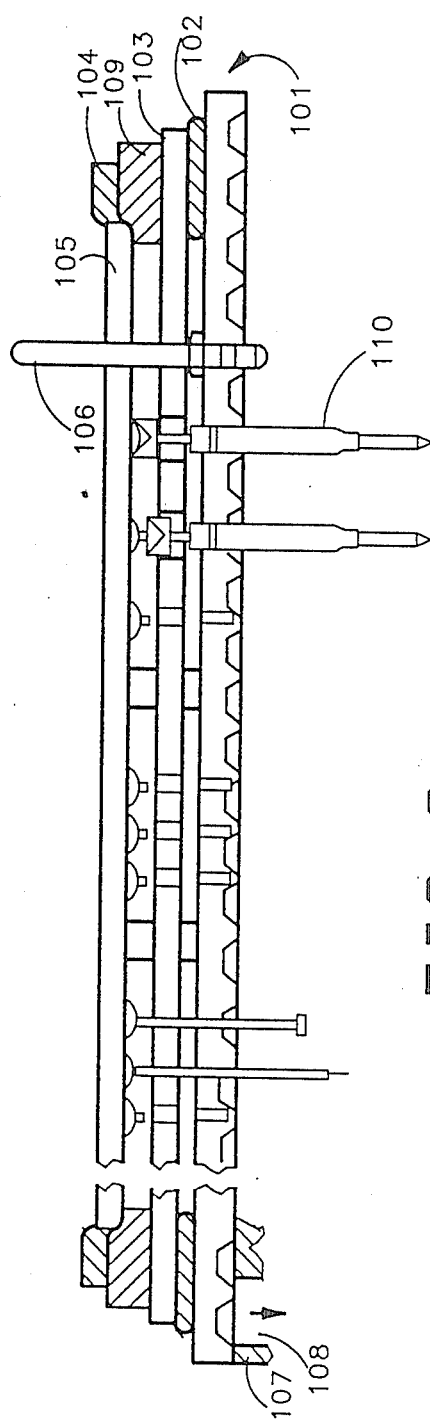
FIG. 6 is a fragmentary elevational view of the preferred embodiment of the present invention with the fixture actuated.
Figure 7:
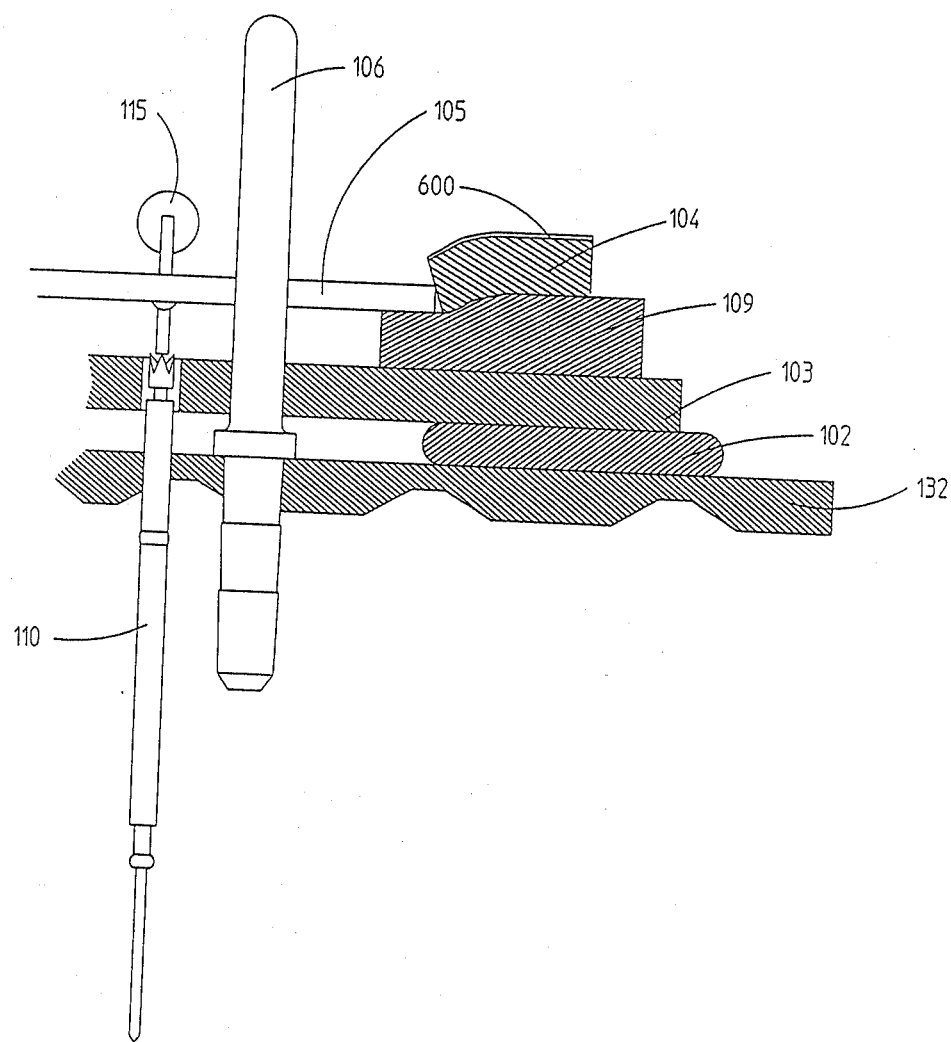
FIG. 7 is an enlarged side view of a portion of the preferred embodiment of the present invention.
Figure 8:
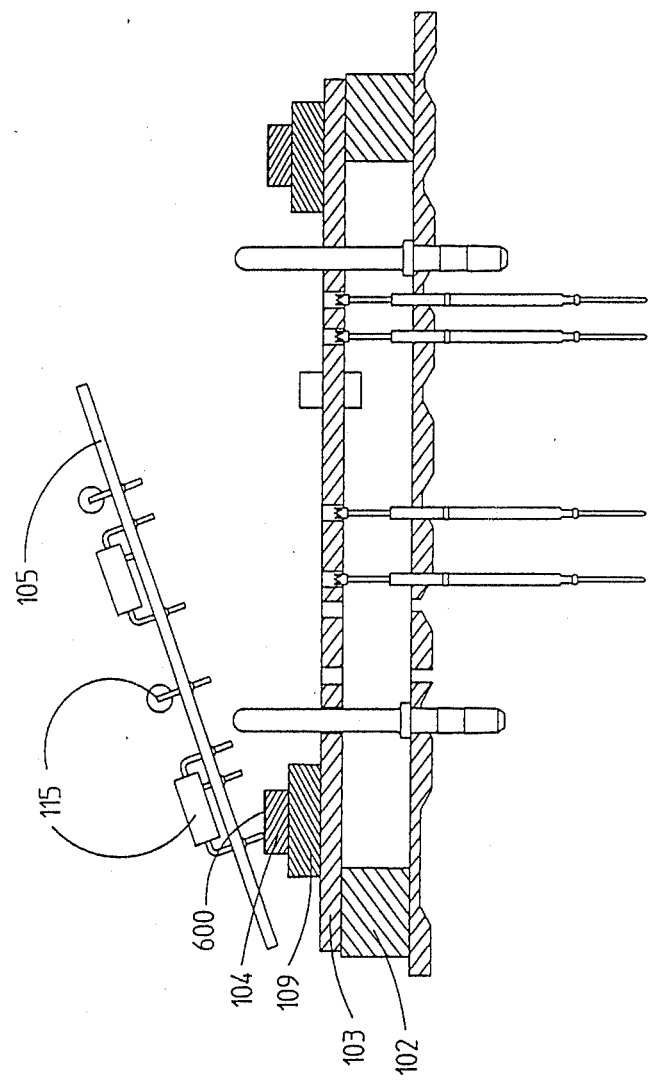
FIG. 8 is a fragmentary elevational view of the preferred embodiment of the present invention with a circuit card being loaded onto the fixture.

The fixture operates as follows. The circuit card 105 is placed on top of the fixture 100 with the tooling holes in the circuit card 105 aligning with tooling pins 106. FIG. 5 is a fragmentary elevational view of the preferred embodiment of the present invention with the fixture released. The fixture is activated by applying a vacuum to the vacuum manifold 108. Air is then drawn from the third vacuum chamber, through the second vacuum chamber, through the first vacuum chamber in the plate assembly 101 and out the manifold 108. The circuit card 105 is drawn into the support plate 103 slightly compressing seal 109 in turn collapsing the seal 104 against the card. The support plate 103 is drawn toward the plate assembly 101 compressing the seal 102. This causes the probe assembly to firmly contact the circuit card. FIG. 6 is a fragmentary elevational view of the preferred embodiment of the present invention with the fixture actuated. The seal 102 is compressed down to twenty to thirty percent of its original height. This travel may be limited by stops.

The present invention may be easily serviced by overcoming the adhesion of the low tack tape and lifting the support plate off the top of the test fixture, replacing probes and cleaning as required and then sliding the support plate over the tooling pins.

Alternate embodiments are contemplated in which the plate assembly 101 is replaced by a traditional probe plate on small fixtures. The vacuum manifold would then be connected directly into the second vacuum chamber. This reduces costs for small fixtures.

We claim:

1. A board test fixture for interfacing a card having electronic devices at fixed predetermined locations to a test system interface having connection points at fixed predetermined locations, the fixture comprising:
   a scanner plate having electrical contacts at fixed predetermined locations corresponding to the connection points of the test system interface;
   interface means for mounting the scanner plate to the test system interface;
   a support attached to the scanner plate;
   a one piece structurally integrated combination vacuum distribution assembly and probe plate having a first vacuum chamber, a vacuum port and a first plurality of holes passing through the plate at fixed predetermined locations corresponding to the electronic devices on the card;
   probing means, for sending to and receiving electronic signals from the card, mounted in the first plurality of holes in the probe plate;
   a conductor means electrically connecting the electrical contacts of the scanner plate to the probing means;
   a support plate having a plurality of holes at fixed predetermined locations corresponding to the electronic devices on the card;
   first seal means attached to the support plate and contacting the probe plate for forming a first vacuum chamber and biasing the support plate away from the probe plate;
   alignment means mounted in the probe plate for aligning the support plate and the circuit card with the probe plate;
   second seal means attached to the support plate and contacting the circuit card for supporting the circuit card and forming a third vacuum chamber;
   third seal means having a first and second side, the first side attached to the second seal means and the second side having an abrasion resistant shield; and
   whereby vacuum distribution is accomplished within the one piece structurally integrated combination vacuum distribution assembly and probe plate.

2. An apparatus as defined in claim 1 wherein the third seal means comprises a composite of epoxy fiberglass laminant material with a cellular urethane foam.

3. A board test fixture for interfacing a card having electronic devices at fixed predetermined locations to a test system interface having connection points at fixed predetermined locations, the fixture comprising:
   a scanner plate having electrical contacts at fixed predetermined locations corresponding to the connection points of the test system interface;
   interface means for mounting the scanner plate to the test system interface;
   a support attached to the scanner plate;
   a probe plate attached to the support, the probe plate having a vacuum port and a first plurality of holes passing through the plate at fixed predetermined locations corresponding to the electronic devices on the card;
   probing means, for sending to and receiving electronic signals from the card, mounted in the first plurality of holes in the probe plate;
   a conductor means electrically connecting the electrical contacts of the scanner plate to the probing means;
   a support plate having a plurality of holes at fixed predetermined locations corresponding to the electronic devices on the card;
   first seal means attached to the support plate and contacting the probe plate for forming a first vacuum chamber and biasing the support plate away from the probe plate;
   alignment means mounted in the probe plate for aligning the support plate and the circuit card with the probe plate;
   second seal means attached to the support plate and contacting the circuit card for supporting the circuit card and forming a second vacuum chamber; and
   third seal means having a first and second side, the first side attached to the second seal means and the second side having an abrasion resistant shield.

4. An apparatus as defined in claim 3 wherein the third seal means comprises a composite of epoxy fiberglass laminant material with a cellular urethane foam.

5. In a board test fixture of the type wherein a card having electronic components is electrically connected to a board test system by withdrawing air from chambers and having a probing assembly including a probe plate for sending to and receiving electronic signals from the card and wherein a first seal is provided to form an airtight connection between the probe plate and a first vacuum chamber and a second seal is provided to form an airtight connection between the card and a second vacuum chamber, the improvement comprising a third seal having a first and second side, the first side of the seal attached to the second seal along the perimeter of the card and the second side having an abrasion resistant shield, whereby the fixture operates more reliably and quietly.

* * * * *

UNITED STATES PATENT AND TRADEMARK OFFICE
CERTIFICATE OF CORRECTION

PATENT NO. : 4,771,234

DATED : September 13, 1988

INVENTOR(S) : Steven J. Cook and Kris J. Kanack

It is certified that error appears in the above-identified patent and that said Letters Patent is hereby corrected as shown below:

Column 1, line 17, "thesee" should read -- these --.

Signed and Sealed this

Twenty-eighth Day of January, 1992

Attest:

HARRY F. MANBECK, JR.

*Attesting Officer*  *Commissioner of Patents and Trademarks*